(12) United States Patent
Fuhrmann et al.

(10) Patent No.: US 7,313,044 B2
(45) Date of Patent: Dec. 25, 2007

(54) INTEGRATED SEMICONDUCTOR MEMORY WITH TEMPERATURE-DEPENDENT VOLTAGE GENERATION

(75) Inventors: Dirk Fuhrmann, Essex Junction, VT (US); Reidar Lindstedt, München (DE)

(73) Assignee: Infineon Technologies, AG, Munich (DE)

( * ) Notice: Subject to any disclaimer, the term of this patent is extended or adjusted under 35 U.S.C. 154(b) by 441 days.

(21) Appl. No.: 11/050,428

(22) Filed: Feb. 4, 2005

(65) Prior Publication Data

US 2005/0174164 A1    Aug. 11, 2005

(30) Foreign Application Priority Data

Feb. 5, 2004    (DE) .................... 10 2004 005 667

(51) Int. Cl.
*G11C 7/04* (2006.01)
(52) U.S. Cl. .................. 365/211; 365/212; 365/226
(58) Field of Classification Search ............... 365/211, 365/212, 191, 193, 226, 227, 189.07
See application file for complete search history.

(56) References Cited

U.S. PATENT DOCUMENTS

| 6,084,812 | A  | * | 7/2000  | Joo .......................... 365/222 |
| 6,438,057 | B1 | * | 8/2002  | Ruckerbauer ............... 365/222 |
| 6,809,980 | B2 | * | 10/2004 | Schnabel et al. ........... 365/222 |
| 7,027,343 | B2 | * | 4/2006  | Sinha et al. ................ 365/222 |

* cited by examiner

*Primary Examiner*—Gene N. Auduong
(74) *Attorney, Agent, or Firm*—Edell, Shapiro & Finnan, LLC

(57) ABSTRACT

An integrated semiconductor memory device includes a temperature sensor circuit to generate a temperature-dependent control signal, a reference circuit to generate a temperature-independent reference signal, a comparator circuit and a voltage generator circuit. The comparator circuit generates a first level or second level of an activation signal in a manner dependent on the comparison of the control signal and the reference signal which are both fed to it on an input side. The voltage generator circuit generates a first control signal or a second control signal in a manner dependent on the level of the activation signal. The integrated semiconductor memory enables the generation of two control signals for a selection transistor of a memory cell in a manner dependent on whether the temperature sensor circuit detects a temperature in a first temperature range or in a second temperature range.

23 Claims, 4 Drawing Sheets

INTEGRATED SEMICONDUCTOR MEMORY WITH TEMPERATURE-DEPENDENT VOLTAGE GENERATION

CROSS REFERENCE TO RELATED APPLICATIONS

This application claims priority under 35 U.S.C. §119 to German Application No. DE 10 2004 005 667.6, filed on Feb. 5, 2004, and titled "Integrated Semiconductor Memory with Temperature-Dependent Voltage Generation," the entire contents of which are hereby incorporated by reference.

FIELD OF THE INVENTION

The invention relates to an integrated semiconductor memory with temperature-dependent voltage generation, and in particular, to control voltages of a selection transistor of a DRAM (Dynamic Random Access Memory) memory cell.

BACKGROUND

The current trend in the development of integrated semiconductor memories is aimed at increasingly miniaturizing the memory products and thus reducing internal and external voltages. At the same time, memory products are intended to be designed for an ever larger temperature range, such as use in mobile systems. This leads to ever more stringent requirements in ensuring the functionality of memory products in the specified temperature range. Attempts are currently being made to cover a wide temperature range through optimized design techniques and improved technological methods. In terms of design, voltage regulators are provided, for example, which generate voltages in temperature-independent fashion, in part derived from so-called bandgap circuits. In the case of the methods for fabricating integrated semiconductor memories, use is made of implantation techniques that are intended to ensure the functionality of memory products in an extended temperature range. Optimization of fabrication and design techniques is made more difficult by the fact that different and in part opposing requirements are made of the integrated semiconductor memory in order to ensure the functionality at high and low temperatures.

To illustrate the physical effects that occur at high and low temperatures, a DRAM memory cell is represented in FIG. 1. The memory cell SZ comprises a selection transistor AT and a storage capacitor SC. The first electrode of the storage capacitor SC is connected to a terminal M for applying a reference potential $V_{plate}$. The second electrode of the storage capacitor SC is connected to a bit line BL via a controllable path of the selection transistor. A control terminal ST of the selection transistor is connected to a word line WL. A substrate terminal of the selection transistor is connected to a potential Vbb.

If the memory cell is intended to be accessed, then a potential VPP that switches the selection transistor AT into the on state is generated on the word line. In this case, the storage capacitor is connected to the bit line via the turned-on path of the selection transistor. During a read access, the storage capacitor SC is discharged and alters the potential of the bit line. If a charge corresponding to the logic state 0 (low state) is present on the storage capacitor, then the bit line assumes the potential Vbll. If a charge corresponding to the logic state 1 (high state) is present on the storage capacitor, then the bit line assumes the potential Vblh. If an information item corresponding to the low state is intended to be stored in the memory cell during a write access, then the potential Vbll is generated on the bit line. If an information item corresponding to the high state is intended to be stored in the memory cell, then the potential Vblh is generated on the bit line and correspondingly charges the storage capacitor SC. When the memory cell is not active, the selection transistor is operated in the off-state mode, so that the storage capacitor is not conductively connected to the bit line. The potential VNWLL is generated on the word line WL in this case.

If the integrated semiconductor memory is operated at low temperatures, then the threshold voltage of the selection transistor increases. At the same time, the resistance also increases and thus so does the RC constant for writing an information item to the memory cell. In this case, the increase in the threshold voltage results from the increase in the Fermi voltage and the decrease in the intrinsic charge carrier density at low temperatures. Both effects ensure that, for example, when writing a 1 information item, a lower charge is stored in the storage capacitor SC than is the case at high temperatures.

If the integrated semiconductor memory is operated at higher temperatures, then the threshold voltage decreases. At the same time, the so-called subthreshold swing also increases. The subthreshold swing is a characteristic figure that describes the subthreshold behavior and thus the closing behavior of the selection transistor AT. At high temperatures, increased leakage currents occur when the selection transistor is operated in the off-state region. The consequence is that the charge stored in the storage capacitor SC flows away, which may lead to an information loss of the information stored in the memory cell SZ.

The requirements made of the magnitude of a suitable control voltage of the selection transistor during operation of the memory cell SZ in different temperature ranges are thus opposing. In the low-temperature range, an increase in the control voltage is desirable since the threshold voltage of the selection transistor also increases. In the high-temperature range, by contrast, an increase in the control voltage leads to an increase in the leakage currents, so that the use of a lower control voltage is recommendable in this case. The use of a single control voltage for the operation of the integrated semiconductor memory in the high- and low-temperature ranges therefore requires a compromise in the choice of the control voltages of the selection transistors. As a consequence there are power and quality losses during operation in high- and low-temperature ranges.

SUMMARY OF THE INVENTION

Therefore, one object of the invention is to specify an integrated semiconductor memory with separate optimization of the control voltages of the selection transistors for a high-temperature range and a low-temperature range, and also a method for operating an integrated semiconductor memory designed in this way.

These and other objects are achieved by an integrated semiconductor memory device with temperature-dependent voltage generation and comprising: at least one memory cell comprising a selection transistor, which includes a control terminal for driving the selection transistor; a temperature sensor circuit configured to pick up or determine a temperature of the integrated semiconductor memory device, which circuit includes an output terminal to generate a temperature-dependent control signal; a reference circuit, which includes an output terminal to generate a temperature-independent reference signal; a comparator circuit, which includes an input side and an output terminal to generate an activation signal; a voltage generator circuit, which includes an input terminal configured to apply the activation signal, a first output terminal to generate a first control voltage and a second output terminal to generate a second control voltage. The comparator circuit is connected, on its input side, to the output terminal of the temperature sensor circuit and the output terminal of the reference circuit. The output terminal of the comparator circuit is connected to the input terminal of the voltage generator circuit. The integrated semiconductor memory according to the invention can be operated in a first temperature range and in a second temperature range, the first temperature range lying above the second temperature range. The activation signal is generated by the comparator circuit as a first level activation signal when the temperature picked up or determined by the temperature sensor circuit lies in the first temperature range, and is generated as a second level activation signal when the temperature picked up or determined by the temperature sensor circuit lies in the second temperature range. In this case, the first control voltage is fed to the control terminal of the selection transistor when the voltage generator circuit is driven with the first level activation signal. The second control voltage is fed to the control terminal of the selection transistor when the voltage generator circuit is driven with the second level activation signal.

In one embodiment of the integrated semiconductor memory of the invention, a control voltage that varies as the temperature of the integrated semiconductor memory varies can be generated by the temperature sensor circuit.

In another embodiment of the integrated semiconductor memory of the invention, the temperature sensor circuit comprises a semiconductor component having a temperature-dependent gap between a valence band and a conduction band. In this embodiment, a control voltage that is dependent on the gap between the valence band and the conduction band can be generated by the temperature sensor circuit.

In yet another embodiment of the invention, the temperature sensor circuit contains a pn diode for generating the temperature-dependent control voltage.

In still another embodiment of the integrated semiconductor memory of the invention, the reference circuit includes a first input terminal for applying an actuating signal. In this embodiment, the reference circuit is designed in such a way that a temperature-independent reference voltage can be set by means of the application of the actuating signal.

In a further embodiment of the integrated semiconductor memory of the invention, the reference circuit includes a programmable element and a second input terminal for applying a programming signal for programming the programmable element. In this embodiment, the reference circuit is designed in such a way that the temperature-independent reference voltage can be set in discrete stages in a manner dependent on the programming state of the programmable element. For example, the programmable element can be designed as an electrically programmable non-volatile memory element.

In still another embodiment of the integrated semiconductor memory of the invention, the comparator circuit is designed in such a way that the generated activation signal assumes a first level if the temperature-dependent control voltage present at the first input terminal of the comparator circuit is greater than the reference voltage present at the second input terminal of the comparator circuit. Furthermore, the comparator circuit can generate an activation signal with a second level if the temperature-dependent control voltage present at the first input terminal of the comparator circuit is less than the reference voltage present at the second input terminal of the comparator circuit.

In another embodiment of the integrated semiconductor memory of the present invention, the voltage generator circuit comprises a first charge pump for generating the first control voltage and a second charge pump for generating the second control voltage. The first and second charge pumps in each case include a terminal for activating the respective charge pump. The respective terminals for activating the associated charge pumps are connected to the input terminal of the voltage generator circuit. The first charge pump can be activated upon application of the first level of the activation signal. The second charge pump can be activated upon application of the second level of the activation signal.

In a still further embodiment of the integrated semiconductor memory of the present invention, the voltage generator circuit includes a third output terminal for generating a third control voltage and a fourth output terminal for generating a fourth control voltage. In this embodiment, the voltage generator circuit comprises a third charge pump for generating the third control voltage and a fourth charge pump for generating the fourth control voltage. The third and fourth charge pumps in each case include a terminal for activating the respective charge pump. The respective terminals for activating the associated charge pumps are connected to the input terminal of the voltage generator circuit. The third charge pump can be activated upon application of the first level of the activation signal. The fourth charge pump can be activated upon application of the second level of the activation signal. The third control voltage is fed to the control terminal of the selection transistor if the temperature picked up by the temperature sensor circuit lies in the first temperature range. The fourth control voltage is fed to the control terminal of the selection transistor if the temperature picked up by the temperature sensor circuit lies in the second temperature range.

In yet another embodiment of the integrated semiconductor memory of the invention, the voltage generator circuit comprises a fifth charge pump for generating the first control voltage, a first controllable switch including a control terminal, and a first additional circuit for voltage boosting of a voltage applied on the input side, including an input terminal for applying the first control voltage. The second control voltage can be generated by means of the first additional circuit with the first control voltage being fed in on the input side. The first additional circuit is connected, on the output side, to the second output terminal of the voltage generator circuit for generating the second control voltage. The control terminal of the first controllable switch is connected to the input terminal of the voltage generator circuit. The first controllable switch can be switched into a first switching state upon application of the first level of the activation signal and into a second switching state upon application of the second level of the activation signal. In the first switching state of the first controllable switch, the fifth charge pump is connected, on the output side, to the first output terminal of the voltage generator circuit for generating the first control voltage. In the second switching state of the first controllable switch, the fifth charge pump is connected, on the output side, to the input terminal of the first additional circuit.

In another embodiment of the integrated semiconductor memory of the invention, the voltage generator circuit includes a third output terminal for generating a third control voltage and a fourth output terminal for generating a fourth control voltage. In this embodiment variant, the voltage generator circuit comprises a sixth charge pump for generating the third control voltage, a second controllable switch including a control terminal, and a second additional circuit for voltage boosting of a voltage applied on the input side, including an input terminal for applying the third control voltage. The fourth control voltage can be generated by means of the second additional circuit with the first control voltage being fed in on the input side. The second additional circuit is connected, on the output side, to the fourth output terminal of the voltage generator circuit for generating the fourth control voltage. The control terminal of the second controllable switch is connected to the input terminal of the voltage generator circuit. The second controllable switch can be switched into a first switching state upon application of the first level of the activation signal and into a second switching state upon application of the second level of the activation signal. In the first switching state of the second controllable switch, the sixth charge pump is connected, on the output side, to the third output terminal of the voltage generator circuit for generating the third control voltage. In the second switching state of the second controllable switch, the sixth charge pump is connected, on the output side, to the input terminal of the second additional circuit. The third control voltage can be fed to the control terminal of the selection transistor if the temperature picked up by the temperature sensor circuit lies in the first temperature range. The fourth control voltage can be fed to the control terminal of the selection transistor if the temperature picked up by the temperature sensor circuit lies in the second temperature range.

In a still further embodiment of the integrated semiconductor memory of the invention, the output terminal of the comparator circuit can be connected to the input terminal of the voltage generator circuit via a clock-controlled switch.

In yet another embodiment of the integrated semiconductor memory of the invention, the first control voltage that can be generated in the first temperature range includes a lower voltage value in comparison with the second control voltage that can be generated in the second temperature range. Furthermore, the third control voltage that can be generated in the first temperature range has a more negative voltage value in comparison with the second control voltage that can be generated in the second temperature range. If the third and fourth control voltages are formed as negative voltages, by way of example, then the third control voltage has a more negative value than the fourth control voltage.

In a further embodiment of the integrated semiconductor memory of the invention, the first and second control voltages of the voltage generator circuit are designed in such a way that, when the memory cell is accessed, the selection transistor can be turned on by the application of the first or second control voltage. The third and fourth control voltages are designed in such a way that, when the memory cell is not active, the selection transistor can be operated in the off-state mode by the application of the third or fourth control voltage.

In addition, a method of operating an integrated semiconductor memory of the invention includes using the integrated semiconductor memory, which can be operated in a first temperature range and in a second temperature range, according to one of the embodiments described above. In this case, the first temperature range lies below the second temperature range. A reference circuit generates a temperature-independent reference signal. In this case, the reference signal is preferably formed as a reference voltage. A temperature sensor circuit generates a temperature-dependent control signal. In this case, the control signal is preferably formed as a control voltage. A comparator circuit compares the temperature-dependent control signal with the temperature-independent reference signal and generates an activation signal in a manner dependent on this comparison. If the temperature sensor circuit detects a temperature in the first temperature range, then the comparator circuit generates a first level of the activation signal on the output side. If the activation signal assumes a first level, then a voltage generator circuit generates a first control voltage for controlling a selection transistor of a memory cell. If the temperature sensor circuit detects a temperature in the second temperature range, then the comparator circuit generates a second level of the activation signal on the output side. If the activation signal assumes a second level, then the voltage generator circuit generates a second control voltage for controlling the selection transistor of the memory cell.

In another embodiment of the method for operating an integrated semiconductor memory of the invention, the reference circuit generates a temperature-independent reference voltage on the output side as a result of an actuating signal being applied on the input side.

In still another embodiment of the method for operating an integrated semiconductor memory of the invention, the reference circuit includes a programmable element. The programmable element is programmed by a programming signal being applied on the input side. The reference circuit generates a temperature-independent reference voltage on the output side in a manner dependent on the state of the programmable element.

In a further embodiment of the method for operating an integrated semiconductor memory of the invention, the temperature sensor circuit generates a control voltage that is linearly dependent on the temperature of the integrated semiconductor memory.

In a still further embodiment of the method for operating an integrated semiconductor memory of the invention, the temperature sensor circuit generates the control voltage above the reference voltage if the temperature sensor circuit detects a temperature in the first temperature range. By contrast, if the temperature sensor detects a temperature in the second temperature range, then the temperature sensor circuit generates the control voltage below the reference voltage.

In yet another embodiment of the method for operating the integrated semiconductor memory of the invention, a clock-controlled switch is provided between the output terminal of the comparator circuit and the input terminal of the voltage generator circuit. The activation signal is fed to the voltage generator circuit via a clock-controlled switch. The clock-controlled switch is driven by a clock signal with a period duration. The clock-controlled switch is momentarily closed and opened again during the period duration of the clock signal, the period duration being set by way of the frequency of the clock signal.

The above and still further objects, features and advantages of the present invention will become apparent upon consideration of the following detailed description of specific embodiments thereof, particularly when taken in conjunction with the accompanying drawings where like numerals designate like components.

DESCRIPTION OF THE PREFERRED EMBODIMENTS

Figure 2:
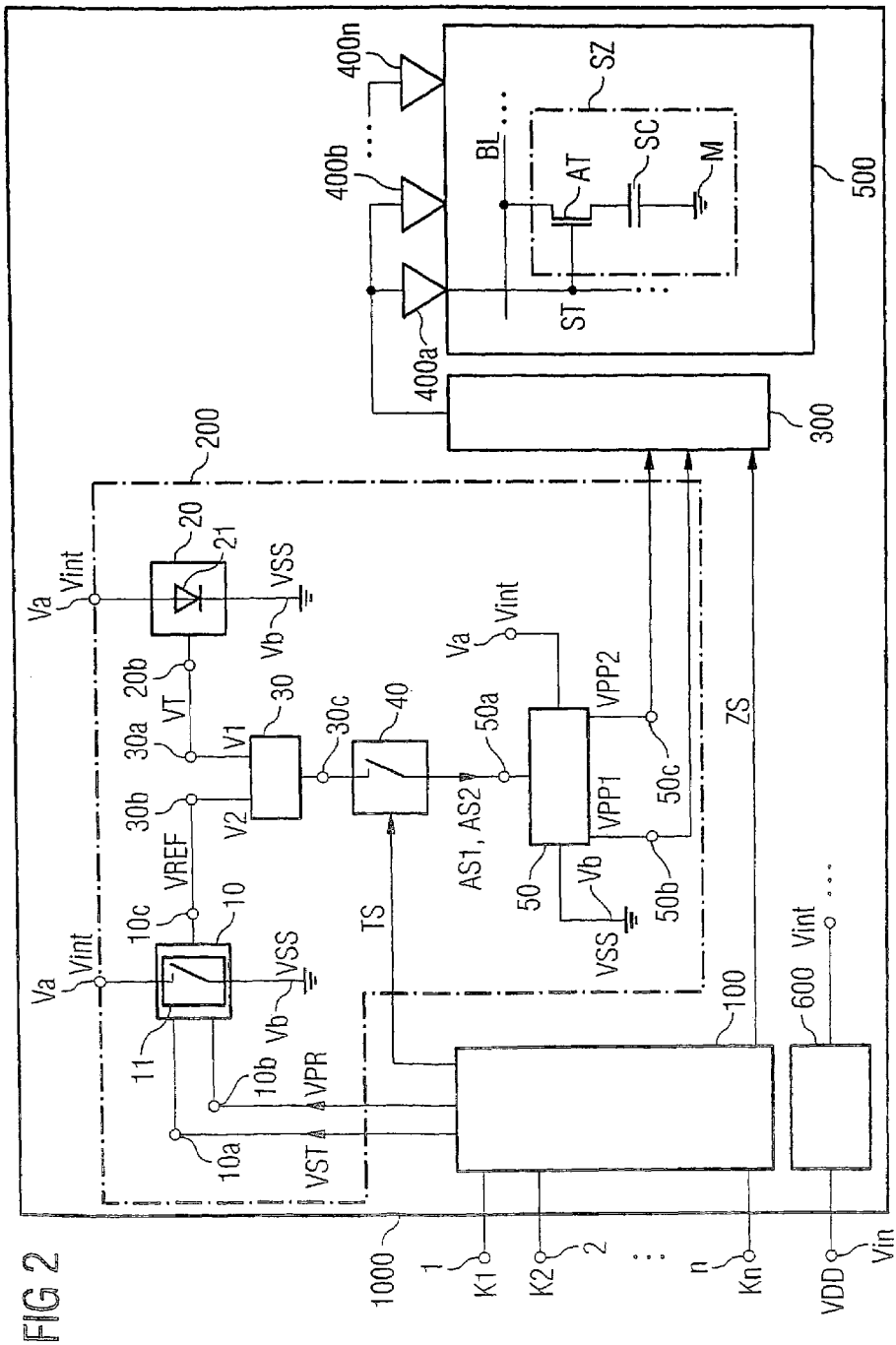
FIG. 2 depicts an integrated semiconductor memory for generating temperature-dependent voltages according to the invention.

In accordance with the invention, an integrated semiconductor memory 1000 is depicted in FIG. 2 and includes input terminals 1, 2, . . . , n and a terminal Vin for applying a supply potential VDD. The integrated semiconductor memory includes a control/logic circuit 100, which is connected, on the input side, to the input terminals 1, 2, . . . , n of the integrated semiconductor memory. Command signals K1, K2, . . . , Kn are applied to the input terminals 1, 2, . . . , n during operation of the integrated semiconductor memory. The control circuit evaluates the command signals and generates, on the output side, control signals for controlling the integrated semiconductor memory. The control signals include an actuating signal VST, a programming signal VPR, a clock signal TS and an access signal ZS.

Figure 1:
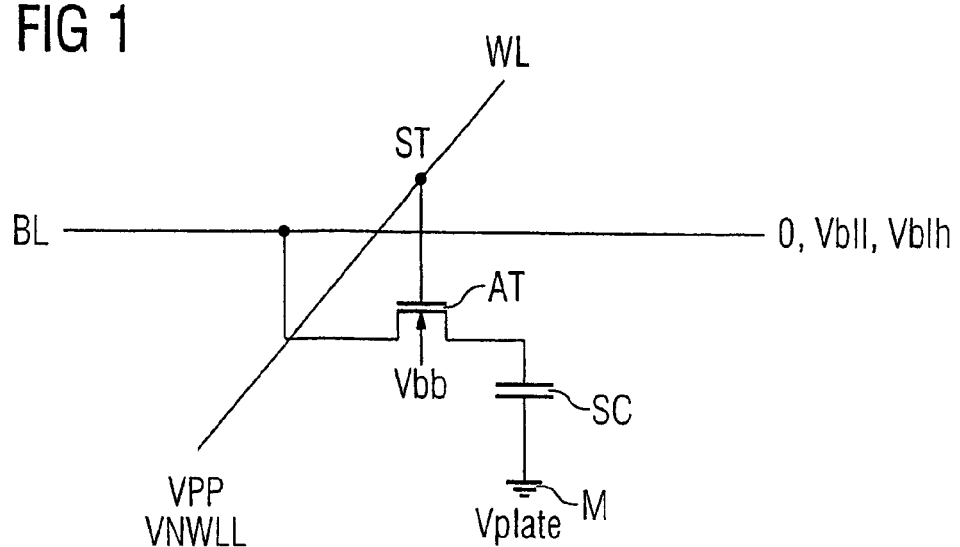
FIG. 1 depicts a DRAM memory cell with connected word and bit line.

The integrated semiconductor memory further includes a decoder circuit 300, which can be driven by the control circuit 100 by means of the access signal ZS. The decoder circuit 300 is connected, on the output side, to the word lines of a memory cell array 500 via word line drivers 400a, 400b, . . . , 400n. For the sake of clarity, only one word line WL, one bit line BL and one memory cell SZ are illustrated for the memory cell array 500. The memory cell of the integrated semiconductor memory is designed as a DRAM memory cell in the exemplary embodiment of FIG. 2. Its construction and its function correspond to the DRAM memory cell described in FIG. 1. The selection transistor AT is connected by its control terminal ST to the word line WL. The controllable path of the selection transistor is connected to the bit line BL.

The integrated semiconductor memory further includes a circuit unit 600, which is connected, on the input side, to the terminal Vin for applying the supply potential VDD and provides an internal supply potential Vint on the output side. The internal supply potential Vint represents a stable voltage supply for circuit components of the integrated semiconductor memory.

The integrated semiconductor memory also includes a circuit unit 200 for generating temperature-dependent control voltages for the selection transistor AT of the memory cell SZ of the memory cell array 500. The circuit unit 200 includes a voltage reference circuit 10 having a first input terminal 10a for applying the actuating signal VST, a second input terminal 10b for applying the programming signal VPR and an output terminal 10c for generating a temperature-independent reference signal VREF. Furthermore, the integrated semiconductor memory includes a temperature sensor circuit 20 for picking up the chip temperature of the integrated semiconductor memory having an output terminal 20b for generating a temperature-dependent control signal VT. The output terminal 20b of the temperature sensor circuit 20 is connected to a first input terminal 30a of a comparator circuit 30 for applying a first comparison signal V1. The output terminal 10c of the voltage reference circuit 10 is connected to a second input terminal 30b of the comparator circuit 30 for applying a second comparison signal V2. The comparator circuit 30 has an output terminal 30c for generating an activation signal AS, which output terminal is connected to an input terminal 50a of a voltage generator circuit 50 via a clock-controlled switch 40. The voltage generator circuit has a first output terminal 50b for generating a first control voltage VPP1 and a second output terminal 50c for generating a second control voltage VPP2. The first control voltage VPP1 and the second control voltage VPP2 are fed to the decoder circuit 300 on the input side. The reference circuit 10, the temperature sensor circuit 20 and the voltage generator circuit 50 in each case have a terminal Va for applying the internal supply potential Vint and a terminal Vb for applying the ground potential VSS.

An exemplary method is provided below for operation of the circuit unit 200 for generating the temperature-dependent control voltages for the selection transistor AT of the memory cell SZ of the memory cell array 500.

The temperature sensor circuit 20 generates the temperature-dependent control signal VT in a manner dependent on the chip temperature of the integrated semiconductor memory. In this case, the chip temperature of the integrated semiconductor memory is dependent on the operating conditions of the integrated semiconductor memory, for example the clock frequency with which the semiconductor memory is operated, and also on influences from the surroundings of the chip. The temperature sensor circuit may be designed as a so-called band-gap temperature sensor, by way of example. In this configuration, it generates for example a stable control voltage VT that is linearly dependent on the temperature at its output terminal 20b. In this case, the band-gap temperature sensor utilizes the temperature dependence of the band gap between the conduction and valance bands of a semiconductor component. The band gap decreases as the temperature increases in the case of semiconductor components, for example a pn diode 21. However, any other space-saving CMOS circuit having a suitable temperature coefficient can also be used as an alternative to the band-gap temperature sensor.

In contrast to the temperature sensor circuit, the voltage reference circuit 10 generates the temperature-independent reference signal VREF at its output terminal 10c. In this case, the reference signal VREF can be set by means of an actuating signal VST provided by the control circuit 100. In a first embodiment of the voltage reference circuit 10, the actuating signal VST is a trimmable actuating voltage that can be set by means of software, by way of example. Depending on the magnitude of the trimmable actuating voltage VST, the reference signal can be set in a continuously variable manner in the form of a reference voltage VREF on the output side. In a further embodiment of the temperature sensor circuit, the reference voltage VREF is set by means of the programming signal VPR provided by the control circuit. In this configuration, the reference circuit includes at least one programmable element 11, which is depicted as a controllable switch in FIG. 2. The controllable element 11 is designed for example as an electrically programmable nonvolatile memory element that can be programmed by means of the programming signal VPR. The reference voltage VREF can thus be predefined in discrete steps depending on the programming state of the programmable element.

The temperature-dependent control voltage VT of the temperature sensor circuit 20 is fed to the comparator circuit 30 via its first input terminal 30a as first comparison voltage V1. The temperature-independent reference voltage VREF of the voltage reference circuit 10 is fed to the second input terminal 30b of the comparator circuit 30 as second comparison voltage V2. The comparator circuit 30 compares the first and second comparison voltages with one another and generates an activation signal AS at its output terminal. The activation signal assumes a first level if the temperature-dependent control voltage VT present at the first input terminal of the comparator circuit 30 is greater than the temperature-independent reference voltage VREF present at the second input terminal of the comparator circuit 30. The activation signal AS assumes a second level if the temperature-dependent control voltage VT present at the first input terminal of the comparator circuit 30 is less than the temperature-independent reference voltage VREF present at the second input terminal of the comparator circuit 30.

If it is presupposed that the temperature sensor circuit 20 generates a control voltage that is linearly dependent on the temperature, then two temperature ranges can be differentiated depending on whether the activation signal has assumed the first level or the second level. If the activation signal generated at the output of the comparator circuit assumes the first level AS1, then the chip temperature lies in a first, higher temperature range, by way of example. If the activation signal generated at the output of the comparator circuit assumes the second level AS2, by way of example, then the chip temperature lies in a second, lower temperature range, by way of example.

In an additional embodiment of the integrated semiconductor memory of the invention, a clock-controlled switch 40 is connected between the output terminal 30c of the comparator circuit 30 and the input terminal 50a of the voltage generator circuit 50. The switch 40 opens or closes at specific time intervals that can be set by way of the frequency of the clock signal TS fed to the clock-controlled switch by the control circuit 100. By means of this refinement of the integrated semiconductor memory according to the invention, frequent switching of the activation signal between the first and second levels is avoided particularly in the transition region between the first and second temperature ranges.

The activation signal AS is fed to the input terminal 50a of the voltage generator circuit 50. The voltage generator circuit activates voltage generators, designed as charge pumps, by way of example, in a manner dependent on the level of the activation signal fed to it and thus generates a first control voltage VPP1 at its first output terminal 50b or a second control voltage VPP2 at its second output terminal 50c. The configuration of the voltage generator circuit 50 is discussed in detail in the description of FIGS. 3 to 6.

The first and second control voltages are fed to the decoder circuit 300 on the input side. The access signal ZS is likewise fed to the decoder circuit 300, the access signal indicating whether the memory cell SZ of the memory cell array 500 is intended to be activated for an access or is intended to be operated in the deactivated state. When the memory cell SZ is accessed, the decoder circuit drives the associated selection transistor AT with the first or second control voltage via the word line driver 400a present on the word line WL.

The circuit unit 200 thus makes it possible, in a manner dependent on whether the temperature sensor circuit detects the chip temperature of the integrated semiconductor memory 1000 in the first temperature range or in the second temperature range, to generate different control voltages VPP1 and VPP2 with which the selection transistor AT is switched into the on state. In the case of a chip temperature in the first temperature range, for example a comparatively high chip temperature, the first control voltage VPP1 can be generated, the value of which lies below the second control voltage VPP2 that can be generated. As a result, the control voltage can be adapted to the decreased threshold voltage. In the case of a chip temperature in the second temperature range, for example a comparatively low chip temperature, the second control voltage can be generated, the value of which lies above the first control voltage. As a result, the control voltage can be adapted to the increased threshold voltage. The use of different control voltages for high and low temperatures that lead to the decrease or increase in the threshold voltage of the selection transistor makes it possible to optimize the switching behavior of the selection transistor AT of the memory cell SZ separately for a low- and high-temperature range.

Figure 3:
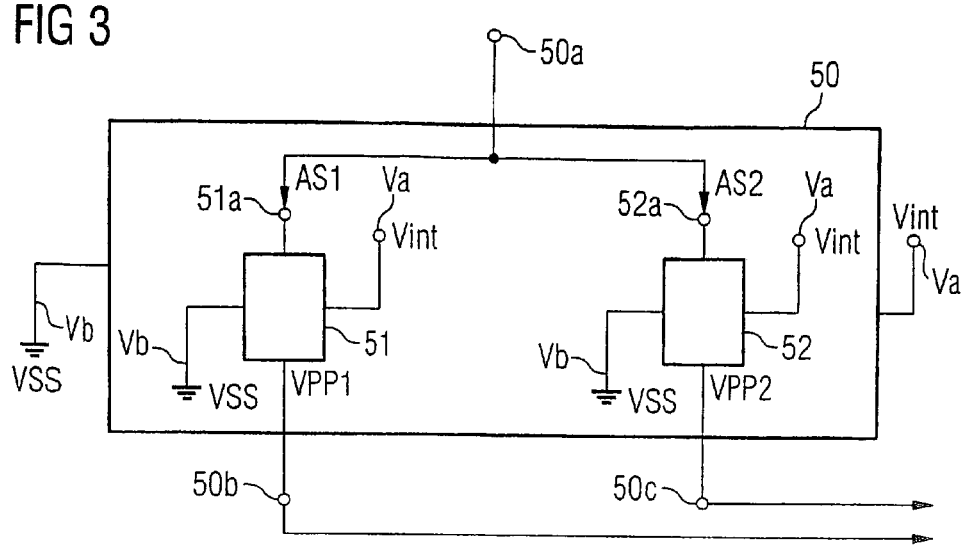
FIG. 3 depicts a first embodiment of a voltage generator circuit according to the invention.

FIGS. 3 to 6 in each case show embodiments of the voltage generator circuit 50. FIG. 3 shows a first embodiment of the voltage generator circuit having an input terminal 50a, a first output terminal 50b and a second output terminal 50c. The voltage generator circuit 50 includes a first charge pump 51 for generating the first control voltage VPP1 and a second charge pump 52 for generating the second control voltage VPP2. The two charge pumps in each case have a first terminal Va for applying the internal supply potential Vint and a terminal Vb for applying the reference potential VSS. The first charge pump 51 is connected to the first output terminal 50b from the output side. The second charge pump 52 is connected to the second output terminal 50c on the output side. The first charge pump 51 has a terminal 51a for applying the activation signal AS. The second charge pump 52 has a terminal 52a for applying the activation signal AS.

If the comparator circuit 30 illustrated in FIG. 2 applies a first level of the activation signal AS1, for example upon operation of the integrated semiconductor memory in the high-temperature range, to the input terminal 50a of the voltage generator circuit 50, then the first charge pump 51 is activated and generates the first control voltage VPP1. If the comparator circuit 30 applies a second level of the activation signal AS2, for example upon operation of the integrated semiconductor memory in the low-temperature range, to the input terminal 50a of the voltage generator circuit, then the second charge pump 52 is activated and generates the second control voltage VPP2. In this case, the charge pumps 51 and 52 are designed in such a way that the control voltage VPP1 generated by the first charge pump 51 lies below the control voltage VPP2 generated by the second charge pump 52. The first and second control voltages are used during an access to a memory cell for switching the selection transistor of the memory cell into the on state.

Figure 4:
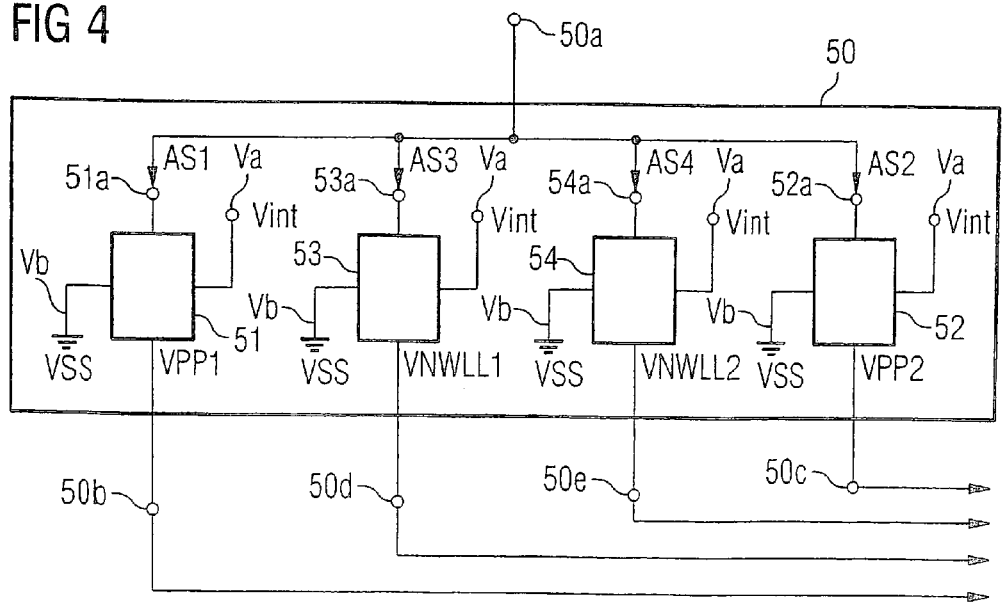
FIG. 4 depicts a second embodiment of a voltage generator circuit according to the invention.

FIG. 4 shows a further embodiment of the voltage generator circuit 50 including an input terminal 50a, a first output terminal 50b, a second output terminal 50c, a third output terminal 50d and a fourth output terminal 50e, where all the output terminals 50a–d extend and connect with the decoder circuit 300 for transferring the various voltage signals to the decoder circuit. The voltage generator circuit includes a first charge pump 51 for generating a first control voltage VPP1, which is connected to the first output terminal

50*b* of the voltage generator circuit 50, a second charge pump 52 for generating a second control voltage VPP2, which is connected to the second output terminal 50*c* of the voltage generator circuit, a third charge pump 53 for generating a third control voltage VNWLL1, which is connected to the third output terminal 50*d* of the voltage generator circuit, and a fourth charge pump 54 for generating a fourth control voltage VNWLL2, which is connected to the fourth output terminal 50*e* of the voltage generator circuit. The charge pumps 51, . . . , 54 in each case have a first terminal Va for applying the internal supply potential Vint and a terminal Vb for applying the reference potential VSS. Furthermore, the charge pumps 51, . . . , 54 in each case have a terminal 51*a*, 52*a*, 53*a*, 54*a* for activating the respective charge pump.

If the comparator circuit 30 illustrated in FIG. 2 applies the activation signal with the first level AS1, for example upon operation of the integrated semiconductor memory in the high-temperature range, to the input terminal 50*a* of the voltage generator circuit, then the first charge pump 51 is activated and generates the first control voltage VPP1. At the same time, the third charge pump 53 is also activated and generates the third control voltage VNWLL1. If the comparator circuit 30 applies the activation signal with the second level AS2, for example upon operation of the integrated semiconductor memory in the low-temperature range, to the input terminal 50*a* of the voltage generator circuit, then the second charge pump 52 is activated and generates the second control voltage VPP2. At the same time, the fourth charge pump 54 is also activated and generates the fourth control voltage VNWLL2. In this case, the charge pumps are designed in such a way that the control voltage VPP1 generated by the first charge pump 51 lies below the control voltage VPP2 generated by the second charge pump 52 and that the third control voltage VNWLL1 generated by the third charge pump 53 lies below the fourth control voltage VNWLL2 generated by the fourth charge pump 54. Since the third and fourth control voltages are preferably formed as negative voltages, the third control voltage VNWLL1 is generated with a more negative voltage level than the fourth control voltage VNWLL2. The first and second control voltages VPP1 and VPP2 are used during an access to a memory cell for switching the selection transistor of the memory cell into the on state. The third and fourth control voltages VNWLL1 and VNWLL2 are used in the deactivated state of the memory cell for operating the selection transistor in the off-state region.

Figure 5:
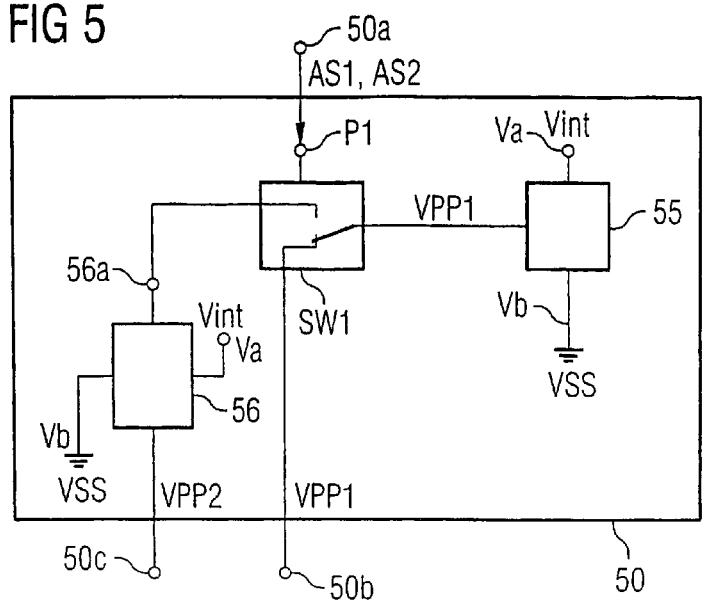
FIG. 5 depicts a third embodiment of a voltage generator circuit according to the invention.

FIG. 5 shows a further embodiment of the voltage generator circuit 50 including an input terminal 50*a*, a first output terminal 50*b* and a second output terminal 50*c*. The voltage generator circuit includes a fifth charge pump 55 for generating a first control voltage VPP1, a controllable switch SW1 having a control terminal P1 for applying the activation signal AS, and also an additional circuit 56 for voltage boosting of a voltage applied on the input side having an associated input terminal 56*a*. The fifth charge pump 55 and the additional circuit 56 are in each case connected between a terminal Va for applying the internal supply potential Vint and a terminal Vb for applying the ground potential VSS. The additional circuit is designed in such a way that it generates the second control voltage VPP2 when the first control voltage VPP1 is applied on the input side.

If the comparator circuit generates a first level of the activation signal AS1, for example upon operation of the integrated semiconductor memory in the high-temperature range, then the controllable switch SW1 assumes a first switching state and, on the output side, connects the fifth charge pump 55 to the first output terminal 50*b* of the voltage generator circuit. The first control voltage VPP1 is generated at the output terminal 50*b* in this case. If the comparator circuit generates a second level of the activation signal AS2, for example upon operation of the integrated semiconductor memory in the low-temperature range, then the controllable switch SW1 assumes a second switching state and, on the output side, connects the fifth charge pump 55 to the input terminal 56*a* of the additional circuit 56. The first control voltage VPP1 is fed to the additional circuit 56 in this operating state. The additional circuit consequently generates the second control voltage VPP2 at a second output terminal 50*c* of the voltage generator circuit. The first and second control voltages VPP1 and VPP2 are used during an access to a memory cell SZ for switching the selection transistor AT of the memory cell into the on state.

Figure 6:
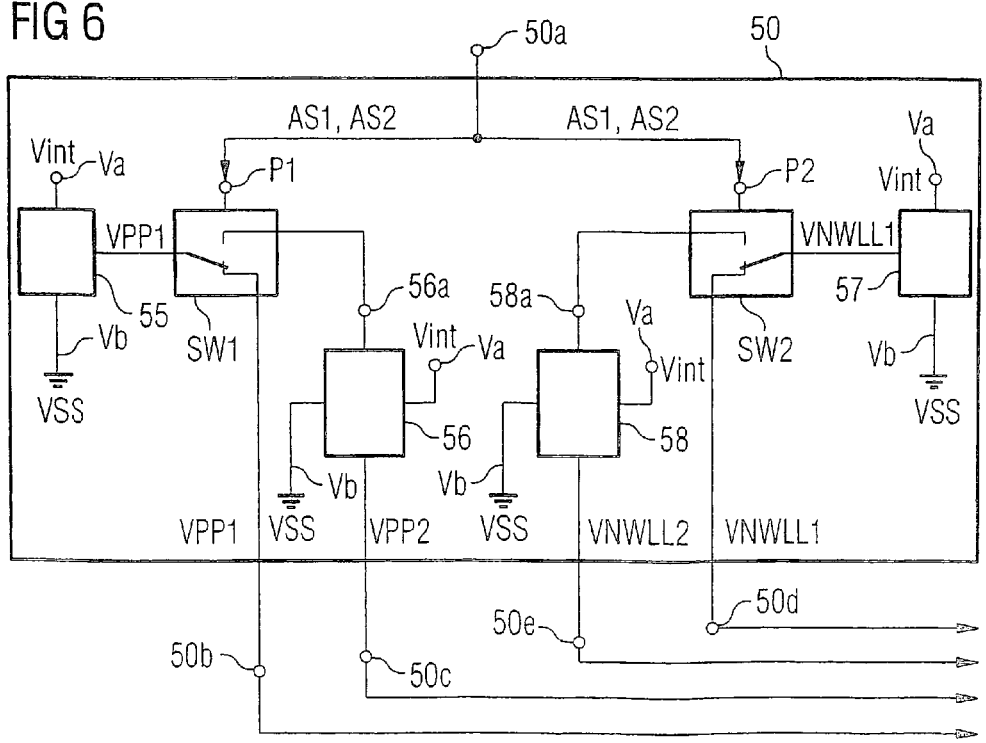
FIG. 6 depicts a fourth embodiment of a voltage generator circuit according to the invention.

FIG. 6 shows a further embodiment of the voltage generator circuit 50 including an input terminal 50*a*, a first output terminal 50*b*, a second output terminal 50*c*, a third output terminal 50*d* and a fourth output terminal 50*e* (where all the output terminals are connected to the decoder circuit 300 for delivering voltage signals to the decoder circuit). The voltage generator circuit includes the fifth charge pump 55 already described in FIG. 5, by means of which the first control voltage VPP1 can be generated, the first controllable switch SW1 and the first additional circuit 56, by means of which the second control voltage VPP2 can be generated from the first control voltage VPP1. In addition to this first circuit unit, the voltage generator circuit in this refinement includes a second circuit unit constructed in an identical manner. The second circuit unit serves for generating a third control voltage VNWLL1 and a fourth control voltage VNWLL2. It includes a sixth charge pump 57 for generating the third control voltage VNWLL1, a second controllable switch SW2 having a control terminal P2, and a second additional circuit 58 for voltage boosting of a voltage applied on the input side having an associated input terminal 58*a*. The sixth charge pump 57 and the additional circuit 58 are in each case connected between a terminal Va for applying the internal supply potential Vint and a terminal Vb for applying the ground potential VSS. The additional circuit 58 is designed in such a way that it generates the fourth control voltage VNWLL2 when the third control voltage VNWLL1 is applied on the input side. The functioning of the second circuit unit to generate control voltages VNWLL1 and VNWLL2 corresponds to the functioning of the circuit unit generating the same control voltages as described in FIG. 4. In contrast to the first and second control voltages used during the access to the memory cell SZ for switching the selection transistor into the on state, the third and fourth control voltages VNWLL1 and VNWLL2 are used for operating the selection transistor AT in the off-state region during a non-active phase of the memory cell SZ. If the integrated semiconductor memory is operated in the high-temperature range, then the selection transistor AT is driven with the third control voltage VNWLL1 during the non-active phase. If the integrated semiconductor memory is operated in the low-temperature range, then the selection transistor AT is driven with the fourth control voltage VNWLL2 during the non-active phase.

Figure 7:
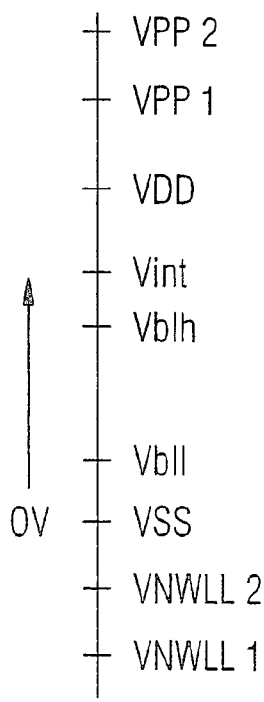
FIG. 7 depicts a voltage scale with control and supply voltages for operating the integrated semiconductor memory according to the invention.

FIG. 7 shows an overview of a selection of voltages required for operating the memory cell SZ in accordance with the invention. The voltages are arranged along a voltage scale in an ascending order of magnitude from bottom to top. The positive voltage range is situated above the 0 V mark and the negative voltage range is situated below this mark. The voltage VSS represents the ground potential and lies at 0 V. The voltage VDD specifies the positive value of the supply potential which is applied externally to the integrated semiconductor memory. The internal supply potential Vint derived therefrom lies on the scale below the external supply potential VDD. The voltage potential Vblh corresponding to the voltage potential of the logic 1 state and the voltage potential Vbll corresponding to the voltage potential of the logic 0 state lie between the ground potential VSS and the internal supply potential Vint in the example of FIG. 7. Lying above the internal reference potential Vint are the first control voltage VPP1 and, above the latter, the second control voltage VPP2, which are in each case applied to the control terminal of the selection transistor in order to turn the selection transistor on. The first control voltage VPP1, which is used in the high-temperature range for this purpose, preferably lies below the second control voltage VPP2, which is used in the low-temperature range. Lying below the reference potential VSS are the third control voltage VNWLL1 and the fourth control voltage VNWLL2, which are applied to the control terminal of the selection transistor in the deactivated state. The third control voltage VNWLL1, which is used in the high-temperature range for operating the selection transistor in the off-state region, in this case preferably lies below the fourth control voltage VNWLL2, which is used in the low-temperature range for operating the selection transistor in the off-state region. The third and fourth control voltages are generally designed as negative voltages, so that the third control voltage VNWLL1 has a more negative voltage value than the fourth control voltage VNWLL2.

While the invention has been described in detail and with reference to specific embodiments thereof, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

LIST OF REFERENCE SYMBOLS

1, . . . , n Input terminals of the semiconductor memory
10 Reference circuit
11 Programmable element
20 Temperature sensor circuit
21 pn diode
30 Comparator circuit
40 Clock-controlled switch
50 Voltage generator circuit
100 Control/logic circuit
200 Circuit unit for temperature-dependent voltage generation
300 Decoding circuit
400 Word line driver
500 Memory cell array
AS Activation signal
AT Selection transistor
BL Bit line
K Command signal
M Reference potential terminal
SC Memory cell
ST Control terminal
TS Clock signal
Va Terminal for applying the internal supply potential
Vb Terminal for applying the ground potential
Vb Substrate potential
Vblh Voltage potential of the logic high state
Vbll Voltage potential of the logic low state
VDD External supply potential
Vin Terminal for applying the supply potential
Vint Internal supply potential
VNWLL Control voltage when selection transistor is not activated
VPP Control voltage for switching the selection transistor into the on state
VPR Programming signal
VREF Reference signal
VSS Ground potential
VST Actuating signal
VT Temperature-dependent control signal
WL Word line
ZS Access signal

What is claimed is:

1. An integrated semiconductor memory device with temperature-dependent voltage generation and that is operable in a first temperature range and in a second temperature range, the first temperature range lying above the second temperature range, the memory device comprising:
at least one memory cell comprising a selection transistor that includes a control terminal to drive the selection transistor;
a temperature sensor circuit configured to determine a temperature of the integrated semiconductor memory device and including an output terminal to generate a temperature-dependent control signal;
a reference circuit including an output terminal to generate a temperature-independent reference signal;
a comparator circuit including an input side and an output terminal to generate an activation signal; and
a voltage generator circuit comprising an input terminal to apply the activation signal, a first output terminal to generate a first control signal and a second output terminal to generate a second control signal;
wherein:
the comparator circuit is connected, via its input side, to the output terminal of the temperature sensor circuit and the output terminal of the reference circuit;
the output terminal of the comparator circuit is connected to the input terminal of the voltage generator circuit;
the activation signal is generated as a first level activation signal when the temperature determined by the temperature sensor circuit lies in a first temperature range;
the activation signal is generated as a second level activation signal when the temperature determined by the temperature sensor circuit lies in a second temperature range;
the first control signal is fed to the control terminal of the selection transistor when the voltage generator circuit is driven with the first level activation signal; and
the second control signal is fed to the control terminal of the selection transistor when the voltage generator circuit is driven with the second level activation signal.

2. The integrated semiconductor memory device of claim 1, wherein the temperature-dependent control signal generated by the temperature sensor circuit varies based upon the temperature of the integrated semiconductor memory device.

3. The integrated semiconductor memory device of claim 1, wherein the temperature sensor circuit comprises a semiconductor component including a temperature-dependent gap between a valence band and a conduction band, and the temperature-dependent control signal generated by the temperature sensor circuit is dependent on the temperature-dependent gap between the valence band and the conduction band.

4. The integrated semiconductor memory device of claim 1, wherein the temperature sensor circuit includes a pn diode to generate the temperature-dependent control signal.

5. The integrated semiconductor memory device of claim 1, wherein the reference circuit includes a first input terminal to apply an actuating signal, and the reference circuit is further configured such that the temperature-independent reference signal is set via application of the actuating signal.

6. The integrated semiconductor memory device of claim 1, wherein the reference circuit includes a programmable element and a second input terminal to apply a programming signal for programming the programmable element, and the reference circuit is further configured such that the temperature-independent reference signal is set in discrete stages and in a manner dependent on the programming state of the programmable element.

7. The integrated semiconductor memory device of claim 6, wherein the programmable element comprises an electrically programmable non-volatile memory element.

8. The integrated semiconductor memory device of claim 5, wherein the temperature-dependent control signal is sent to a first input terminal of the comparator circuit, the reference signal is sent to a second input terminal of the comparator circuit, and the comparator circuit is further configured such that:
   the activation signal is generated as the first level activation signal when the temperature-dependent control signal present at the first input terminal of the comparator circuit is greater than the reference signal present at the second input terminal of the comparator circuit; and
   the generated activation signal is generated as the second level activation signal when the temperature-dependent control signal present at the first input terminal of the comparator circuit is less than the reference signal present at the second input terminal of the comparator circuit.

9. The integrated semiconductor memory device of claim 8, wherein the voltage generator circuit comprises a first charge pump configured to generate the first control signal and a second charge pump configured to generate the second control signal, each of the first and second charge pumps includes a terminal that activates the respective charge pump and is connected to the input terminal of the voltage generator circuit, the first charge pump is activated upon application of the first level activation signal and the second charge pump is activated upon application of the second level activation signal.

10. The integrated semiconductor memory device of claim 9, wherein the voltage generator circuit further comprises:
   a third output terminal to generate a third control signal and a fourth output terminal to generate a fourth control signal; and
   a third charge pump configured to generate the third control signal and a fourth charge pump configured to generate the fourth control signal;
   wherein each of the third and fourth charge pumps includes a terminal to activate the respective charge pump and connected to the input terminal of the voltage generator circuit, the third charge pump is activated upon application of the first level activation signal and the fourth charge pump is activated upon application of the second level activation signal, the third control signal is fed to the control terminal of the selection transistor when the temperature determined by the temperature sensor circuit lies within the first temperature range, and the fourth control signal is fed to the control terminal of the selection transistor when the temperature determined by the temperature sensor circuit lies within the second temperature range.

11. The integrated semiconductor memory device of claim 8, wherein the voltage generator circuit comprises:
   a fifth charge pump configured to generate the first control signal;
   a first controllable switch including a control terminal; and
   a first additional circuit configured to boost a signal applied to its input side and including an input terminal to apply the first control signal, the second control signal being generated by the first additional circuit;
   wherein the first additional circuit is connected, via an output side, to the second output terminal of the voltage generator circuit that generates the second control signal, the control terminal of the first controllable switch is connected to the input terminal of the voltage generator circuit, the first controllable switch is switched into a first switching state upon application of the first level activation signal and into a second switching state upon application of the second level activation signal, the fifth charge pump is connected, via its output side and in the first switching state of the first controllable switch (SW1), to the first output terminal of the voltage generator circuit that generates the first control signal, and the fifth charge pump is further connected, via its output side and in the second switching state of the first controllable switch, to the input terminal of the first additional circuit.

12. The integrated semiconductor memory device of claim 11, wherein the voltage generator circuit further comprises:
   a third output terminal to generate a third control signal and a fourth output terminal to generate a fourth control signal;
   a sixth charge pump configured to generate the third control signal;
   a second controllable switch including a control terminal; and
   a second additional circuit configured to boost a signal applied to its input side and including an input terminal to apply the third control signal, the fourth control signal being generated by the second additional circuit;
   wherein the second additional circuit is connected, on its output side, to the fourth output terminal of the voltage generator circuit that generates the fourth control signal, the control terminal of the second controllable switch is connected to the input terminal of the voltage generator circuit, the second controllable switch is switched into a first switching state upon application of the first level activation signal and into a second switching state upon application of the second level activation signal, the sixth charge pump is connected, on its output side and in the first switching state of the second controllable switch, to the third output terminal of the voltage generator circuit that generates the third control signal, the sixth charge pump is further connected, on its output side and in the second switching state of the second controllable switch, to the input terminal of the second additional circuit, the third control signal is fed to the control terminal of the selection transistor when the temperature determined by the temperature sensor circuit lies in the first temperature range, and the fourth control signal is fed to the control terminal of the selection transistor when the temperature determined by the temperature sensor circuit lies in the second temperature range.

13. The integrated semiconductor memory device of claim 1, wherein the output of the comparator circuit is connected to the input terminal of the voltage generator circuit via a clock-controlled switch.

14. The integrated semiconductor memory device of claim 1, wherein the first control signal generated in the first temperature range has a lower value in comparison with the second control signal generated in the second temperature range.

15. The integrated semiconductor memory device of claim 10, wherein the third control signal generated in the first temperature range has a more negative value in comparison with the second control signal generated in the second temperature range.

16. The integrated semiconductor memory device of claim 1, wherein the first and second control signal of the voltage generator circuit are configured such that, when the memory cell is accessed, the selection transistor is turned on by application of the first or second control signal.

17. The integrated semiconductor memory device of claim 10, in which the third and fourth control signals are configured such that, when the memory cell is not active, the selection transistor is operated in the off-state mode by the application of the third or fourth control signal.

18. A method for operating an integrated semiconductor memory device as recited in claim 1, comprising:
    operating the integrated semiconductor memory device in a first temperature range and in a second temperature range, the first temperature range lying above the second temperature range,
    generating a temperature-independent reference signal via the reference circuit;
    generating a temperature-dependent control signal via the temperature sensor circuit;
    via the comparator circuit, comparing the temperature-dependent control signal with the temperature-independent reference signal and generating an activation signal, wherein the comparator circuit generates a first level activation signal when the temperature sensor circuit detects a temperature in the first temperature range, and the comparator circuit generates a second level activation signal when the temperature sensor circuit detects a temperature in the second temperature range;
    generating a first control signal, via the voltage generator circuit, to control the selection transistor when the first level activation signal is generated; and
    generating a second control signal, via the voltage generator circuit, to control the selection transistor when the second level activation signal is generated.

19. The method of claim 18, wherein the reference circuit generates a temperature-independent reference signal on the output side when an actuating signal is applied on the input side.

20. The method of claim 18, wherein the reference circuit includes a programmable element, the programmable element of the reference circuit is programmed by application of a programming signal, and the reference circuit generates a temperature-independent reference signal on the output side in a manner dependent on the state of the programmable element.

21. The method of claim 18, wherein the temperature sensor circuit generates a control signal that is linearly dependent on the temperature of the integrated semiconductor memory device.

22. The method of claim 19, wherein the temperature sensor circuit generates the control signal above the reference signal if the temperature sensor circuit detects a temperature in the first temperature range, and the temperature circuit generates the control signal at a value below the reference signal when the temperature sensor circuit detects a temperature in the second temperature range.

23. The method of claim 18, wherein a clock-controlled switch is provided between the output terminal of the comparator circuit and the input terminal of the voltage generator circuit, the activation signal is fed to the voltage generator circuit via the clock-controlled switch, the clock-controlled switch is driven by a clock signal with a period duration, the clock-controlled switch is closed and opened again during the period duration of the clock signal, and the period duration is dependent upon the frequency of the clock signal.

* * * * *